(12) United States Patent
Nuechter

(10) Patent No.: US 6,437,659 B1
(45) Date of Patent: Aug. 20, 2002

(54) PUSH-PULL ARRANGEMENT

(75) Inventor: Peter Nuechter, Ulm (DE)

(73) Assignee: DaimlerChrysler AG, Stuttgart (DE)

( * ) Notice: Subject to any disclaimer, the term of this patent is extended or adjusted under 35 U.S.C. 154(b) by 18 days.

(21) Appl. No.: 09/584,509

(22) Filed: May 31, 2000

(30) Foreign Application Priority Data

May 31, 1999 (DE) .......................... 199 24 716

(51) Int. Cl.$^7$ .............................. H01P 1/20; H03H 7/38
(52) U.S. Cl. .......................... 333/32; 327/119; 455/332; 455/333
(58) Field of Search ........................... 333/32; 455/332, 455/333, 323; 327/118, 119

(56) References Cited

U.S. PATENT DOCUMENTS

| | | | | |
|---|---|---|---|---|
| 4,509,208 A | * | 4/1985 | Sogo et al. ................. | 455/317 |
| 4,660,006 A | * | 4/1987 | Tajima et al. ............... | 333/218 |
| 5,008,894 A | * | 4/1991 | Laakmann .................... | 372/81 |
| 5,392,014 A | * | 2/1995 | Nishida et al. .............. | 333/218 |

OTHER PUBLICATIONS

Steven A. Mass, *Microwave Mixers*, $2^{nd}$ Edition, Artech House, 1993, pp. 332–345.

* cited by examiner

Primary Examiner—Benny Lee
Assistant Examiner—Stephen E. Jones
(74) Attorney, Agent, or Firm—Kenyon & Kenyon

(57) ABSTRACT

A cost-effective push-pull arrangement for distributing the power output of the signal from the mixing/local oscillator, so that the transistors are able to be modulated with the same power and with 180° phase shift, and so that, in spite of manufacturing tolerances of the transistor parameters, the signal is effectively decoupled from the other signal gates of the circuit.

8 Claims, 1 Drawing Sheet

PUSH-PULL ARRANGEMENT

FIELD OF THE INVENTION

The present invention relates to a push-pull arrangement for use in frequency multipliers, receiver mixers, signal converters or modulators, which work in accordance with the push-pull principle and which are modulated with the fundamental wave or a subharmonic component of the mixing/local oscillator.

RELATED TECHNOLOGY

An application of the push-pull principle to transistor mixers, both when working with subharmonic, as well as fundamental wave operating modes is described in chapter 9 of Steven A. Maas, *Microwave Mixers*, $2^{nd}$ edition, Artech House, 1993, which is hereby incorporated by reference herein (compare FIG. 9.13, p. 335 and FIG. 9.16, p. 341). In previous design approaches, the power of the mixing/local oscillator is carried through simple phasing lines or through 180° hybrids to the gate terminals of the field effect transistors FET (alternatively: base terminals in the case of bipolar transistors). As the result of unavoidable manufacturing tolerances, the transistors represent unequal terminations for these phase-control signals, which leads to different reflections and, thus, to unequal power distribution and unwanted phase relations. This difficulty can be overcome, but not fundamentally, by partially preconditioning the transistors, or only by allowing for substantial power losses.

SUMMARY OF THE INVENTION

An object of the present invention is to distribute the power output of the signal from the mixing/local oscillator, with the least possible outlay for components, in such a way that the transistors are able to be modulated with respect to one another with the same power and with 180° phase shift, and that, in spite of manufacturing tolerances of the transistor parameters, the signal is effectively decoupled from the other signal gates of the circuit.

The present invention provides a push-pull arrangement, in which the power output of the signal from the mixing/local oscillator is distributed in such a way that the two transistors are able to be modulated with the same power and with 180° phase shift wherein one selects the characteristic wave impedance of the phasing line, i.e., in the case of more stringent band width requirements, the characteristic wave impedance of a one- or multistage hybrid, to match the transistor input resistances and the circuit layout, and that provision is additionally made at the second transistor for a terminating resistor, which is either directly connected or by way of a line having matching characteristic wave impedance.

Accordingly, it is provided, similarly to the case of a traveling-wave amplifier (here, however, simplified to two transistors), to select the characteristic wave impedance of the phasing line, i.e., in the case of more stringent band width requirements, the characteristic wave impedance of a one- or multistage hybrid, to match the transistor input resistances. At the second transistor, provision is additionally made for a terminating resistor either connected directly or by way of a line having matching characteristic wave impedance. To reinforce this, the transistor input impedances can be preconditioned.

An advantage of the present invention lies in that manufacturing tolerances no longer result directly in pronounced changes in matching within a resonance structure, but rather mainly in a slight change in the phase relation of the modulation signals within a certain range of the manufacturing tolerances. One further advantageous embodiment of the present invention provides for the control inputs of transistors T1 and T2 to be provided with a circuit for matching input impedance. Here, the intention is to additionally compensate for any existing manufacturing tolerances of transistors T1 and T2.

BRIEF DESCRIPTION OF THE DRAWINGS

The present invention is described in further detail below with reference to the drawing, in which.

DETAILED DESCRIPTION

Figure 1:
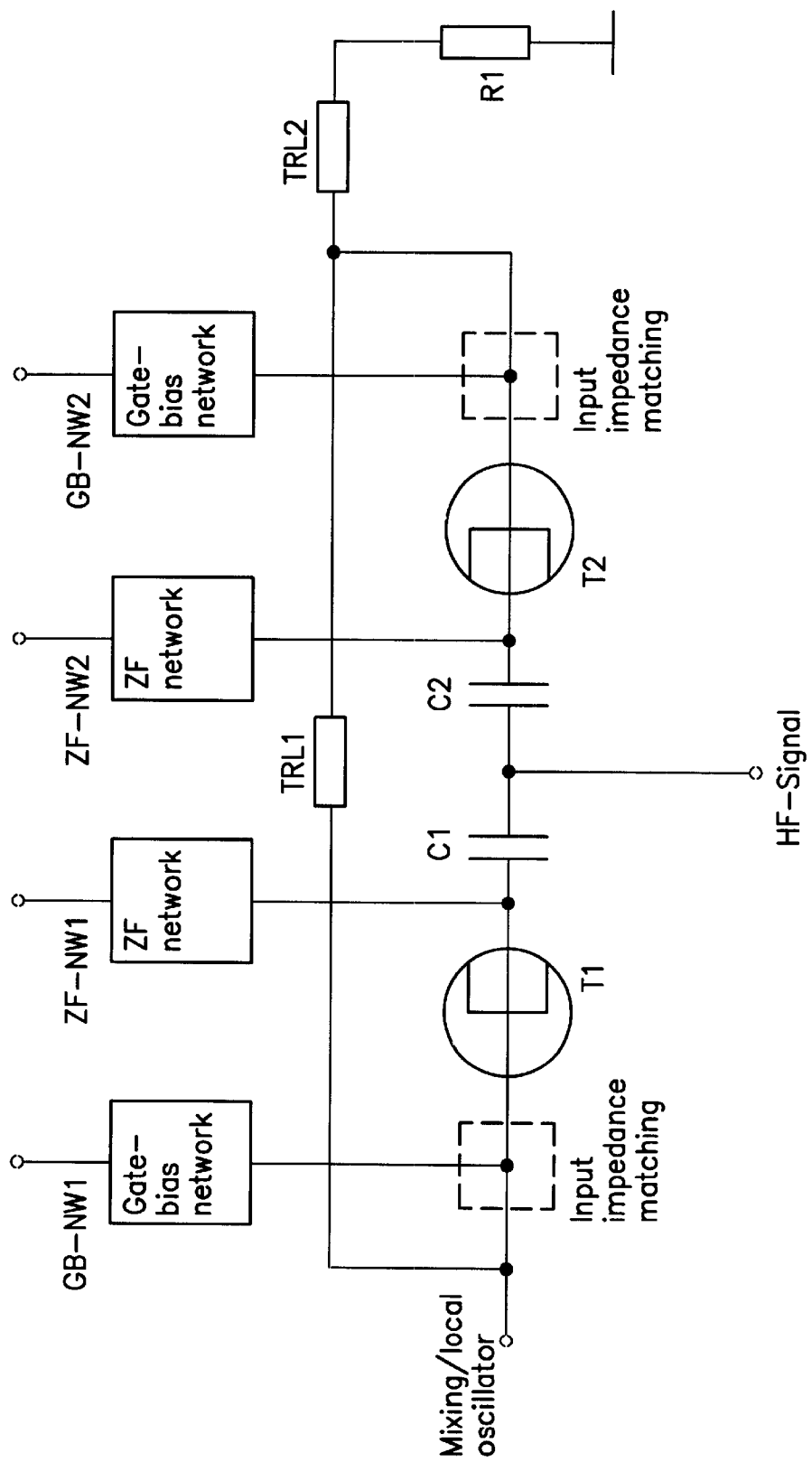
FIG. 1 depicts a schematic circuit diagram of one embodiment of a push-pull arrangement according to the present invention.

Referring to FIG. 1, in conformance with the conventional implementation of a push-pull arrangement, field-effect transistors T1 and T2 are coupled to gate-bias networks GB-NW1 and GB-NW2, as well as to intermediate-frequency networks ZF-NW1 and ZF-NW2. The high-frequency signal at transistors T1 and T2 (at their outputs, or at their inputs, depending on the operational case) is coupled via coupling capacitors C1 and C2. To avoid changes in matching stemming from the manufacturing tolerances of the two transistors T1 and T2 within the resonance structure, the control inputs of transistors T1 and T2 are not only interconnected via a 180° delay line, or, in the case of more stringent band width requirements, via a one or multi-stage hybrid, TRL1, but provision is additionally made at second transistor T2 for a terminating resistor R1, which is connected either directly or via a terminating line TRL2 having matching characteristic wave impedance. Components TRL1, TRL2 and R1 are to be dimensionally designed (for example, through simulation) so that both transistors T1 and T2 are driven in phase opposition with the same signal amplitude. An important consideration in this context is that the following two conditions be met:

1. Condition for characteristic wave impedance: $Z_{TRL1} \approx Z_{TRL2} = R1$, $Z_{TRLX}$ being the characteristic wave impedances of lines TRL1 and TRL2. In this context, one has to consider that, in practice, $Z_{TRL1}$ and $Z_{TRL2}$ are generally not exactly the same, since shifts in impedance can occur because of junctions and special geometries within the circuit layout.

2. Phase shift: $\phi_{TRL1} \approx 180°$ $\phi_{TRL1}$ corresponding to the phase shift between the control inputs of the two transistors T1 and T2. In this context, however, in dimensionally designing TRL1 one must also take into consideration, inter alia, the transistor input impedance and the line geometry between the transistors and TRL1.

The exemplary embodiment described above does, in fact, relate to the implementation of the push-pull arrangement using field-effect transistors in accordance with the present invention. Of course, it is also conceivable to implement, in a corresponding fashion, a push-pull arrangement using other types of transistors (for example: bipolar transistors).

What is claimed is:

1. A push-pull arrangement comprising:
   a mixing/local oscillator;
   first and second transistors, the second transistor being connected to a terminating resistor; and
   one of a phasing line and a hybrid having a characteristic wave impedance selected to match an input resistance of at least one of the first and the second transistor;

wherein the mixing/local oscillator emits a signal having a power output, the power output being distributed so that the first and second transistors are modulated with a same power and with a 180° phase shift; and wherein the second transistor is connected to the terminating resistor by one of directly or by way of a line having a second characteristic wave impedance, the second characteristic wave impedance matching the characteristic wave impedance of the phasing line or hybrid.

2. The push-pull arrangement as recited in claim 1 wherein the hybrid is a one-stage hybrid.

3. The push-pull arrangement as recited in claim 1 wherein the hybrid is a multistage hybrid.

4. The push-pull arrangement as recited in claim 1 wherein the first and second transistors each include a control input including a circuit for matching impedance.

5. A push-pull arrangement comprising:

a mixing/local oscillator;

first and second transistors, the second transistor being connected to a terminating resistor; and one of a phasing line and a hybrid having a characteristic wave impedance selected to match an input resistance of at least one of the first and the second transistor;

wherein the mixing/local oscillator emits a signal having a power output, the power output being distributed so that the first and second transistors are modulated with a same power and with a 180° phase shift; and wherein the second transistor is connected to the terminating resistor by way of a line having a second characteristic wave impedance, the second characteristic wave impedance matching the characteristic wave impedance of the phasing line or hybrid.

6. The push-pull arrangement as recited in claim 5 wherein the first and second transistors each include a control input including a circuit for matching impedance.

7. A push-pull arrangement comprising:

a mixing/local oscillator;

first and second transistors, the second transistor being connected to a terminating resistor; and one of a phasing line and a hybrid having a characteristic wave impedance selected to match an input resistance of at least one of the first and the second transistor;

wherein the mixing/local oscillator emits a signal having a power output, the power output being distributed so that the first and second transistors are modulated: with a same power and with a 180° phase shift; and wherein the second transistor is directly connected to the terminating resistor.

8. The push-pull arrangement as recited in claim 7 wherein the first and second transistors each include a control input including a circuit for matching impedance.

* * * * *